United States Patent [19]

Smith

[11] Patent Number: 4,472,679
[45] Date of Patent: Sep. 18, 1984

[54] DIAGNOSTIC APPARATUS FOR RADAR PULSE REPETITION FREQUENCY CONTROL CIRCUIT CARD

[75] Inventor: Tracy S. Smith, Mandan, N. Dak.

[73] Assignee: The United States of America as represented by the Secretary of the Air Force, Washington, D.C.

[21] Appl. No.: 324,907

[22] Filed: Nov. 25, 1981

[51] Int. Cl.³ .................. G01R 15/12; G01R 31/02
[52] U.S. Cl. ........................ 324/73 PC; 324/158 F
[58] Field of Search ............ 324/73 PC, 158 F, 73 R, 324/73 AT

[56] References Cited

U.S. PATENT DOCUMENTS

| | | | |
|---|---|---|---|
| 3,760,261 | 9/1973 | Collins | 324/73 R |
| 4,108,358 | 8/1978 | Niemaszyk et al. | 235/302 |
| 4,196,386 | 4/1980 | Phelps | 324/73 PC |
| 4,251,765 | 2/1981 | Mears | 324/51 |
| 4,329,643 | 5/1982 | Neumann | 324/158 F |
| 4,390,837 | 6/1983 | Hotvedt | 324/73 |

Primary Examiner—Gerard R. Strecker
Assistant Examiner—Walter E. Snow
Attorney, Agent, or Firm—Donald J. Singer; Bernard E. Franz

[57] ABSTRACT

A portable circuit tester for troubleshooting a multiplier circuit card of the AN/MPS-9 and the AN/MSQ-2 radar systems, particularly when these systems are van mounted. During normal operation of the circuit tester, the circuit card is completely removed from the equipment console and connected to the test box. The test box circuitry provides the power supply and control selections necessary to operate the circuit card under realistic conditions while also allowing easy access to all components on the circuit card. The output from the test box is fed into one channel of a dual channel oscilloscope, with the input for the other channel coming from a probe connected to the test points on the circuit card being examined.

1 Claim, 3 Drawing Figures

DIAGNOSTIC APPARATUS FOR RADAR PULSE REPETITION FREQUENCY CONTROL CIRCUIT CARD

RIGHTS OF THE GOVERNMENT

The invention described herein may be manufactured and used by or for the Government of the United States for all governmental purposes without the payment of any royalty.

BACKGROUND OF THE INVENTION

This invention relates generally to a means for testing electrical systems and, more particularly, to a portable device for testing circuit cards found in radar systems.

The Air Force employs a number of radar systems of various types to accomplish its mission. Two such radar systems, the AN/MSQ-2 and the AN/MPS-9, are van mounted for easy mobility in the field. These vans contain a large number of vertical equipment consoles which have racks for installing various chassis of electronic devices. One of the electronic units mounted in such a vertical rack is the SSE801-1 Multiplier/Inhibitor which is used to multiply the pulse recurrence frequency of the radar transmitter. This device is primarily composed of circuit components contained on one large printed circuit card. However, the power supply, signal inputs and output, and the factor selector switch used to select the multiplier factor are mounted separate from the circuit card and are connected to it by a ten connector terminal board.

In the event of a malfunction within the SSE801-1 Multiplier/Inhibitor, almost invariably the printed circuit card must undergo troubleshooting. When malfunctions occur on this circuit card, troubleshooting is difficult because of its location in the multiplier chassis and, due to the horizontal manner in which the circuit card is mounted, only one side of the circuit card is accessible. Currently, there is no means of simply, quickly and safely troubleshooting the underside of the circuit card. The present procedure requires the circuit card to be removed from the chassis for troubleshooting and signal tracing with an arrangement of power supplies and signal generators connected to it. This arrangement is awkward, unwieldy, and almost unworkable when maintenance must be performed in the close confines of the radar van. As remote sites are within the operational mission of these radar systems, such field maintenance and troubleshooting must be expected. In addition to the present method being time consuming, the procedure carries with it a certain degree of risk because of shock hazard when dealing with high voltage within the limited working area of the radar van.

The instant invention is the simple, quick and safe way to isolate a defective part anywhere on the multiplier circuit card, thereby making troubleshooting easier and more efficient and generating a savings in both time and money.

SUMMARY OF THE INVENTION

The present invention is an apparatus to be utilized in testing the electronic circuitry found in the SSE801-1 Multiplier/Inhibitor unit of the AN/MPS-9 and the AN/MSQ-2 radar systems.

It is therefore an object of the invention to provide a new and improved system for testing electrical circuitry found in such radar systems.

Another object of the invention is to provide a new and improved circuit tester for troubleshooting radar systems that is portable and low in cost.

Another object of the invention is to provide a circuit tester for radar systems that allows more rapid troubleshooting of the circuit than any known similar system.

According to the invention, the normal input signals for the multiplier circuit card serve as inputs to the invention's circuits which provide the proper multiplier selection to the circuit card under test. The invention also provides the operating voltages necessary to power the circuit card. A test output is provided to a dual channel oscilloscope with the second channel input coming from a probe attached to the circuit card during troubleshooting.

A feature of the invention is the provision of a new and improved multiplier circuit card tester that is reliable and easily maintained.

Another feature of the invention is the provision of a new and improved multiplier circuit card tester that is easily operated within the close confines of a radar van.

Another feature of the invention is the provision of a new and improved electrical circuit testing system which is economical to produce and utilizes conventional, currently available components.

Another feature of the invention is the provision that permits the troubleshooting of the multiplier circuit card utilizing the actual input signal rather than an external signal generator.

These and other advantages, features, and objects of the invention will become more apparent from the following description taken in connection with the illustrative embodiment in the accompanying drawings.

DETAILED DESCRIPTION

Figure 1:
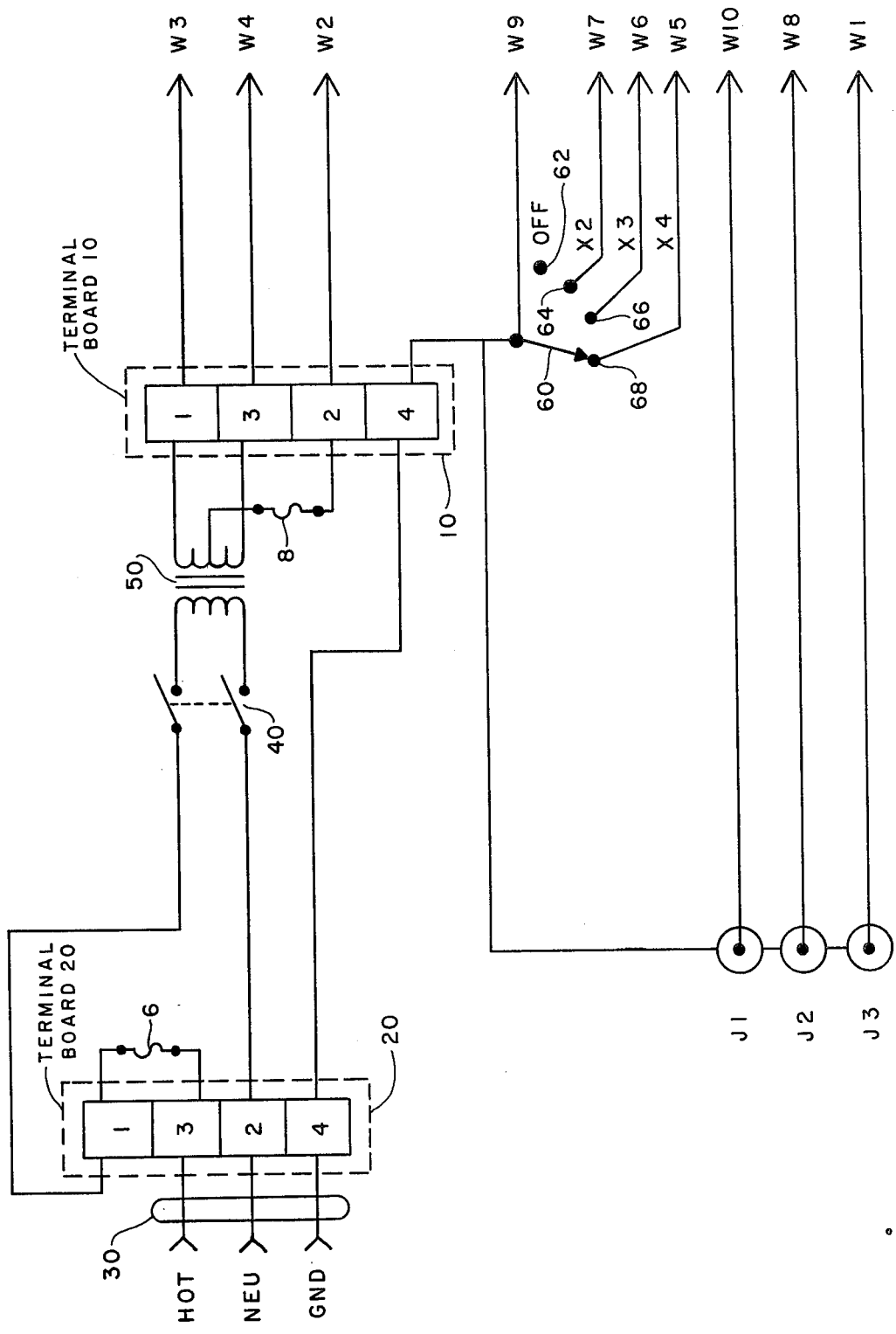
FIG. 1 is a schematic diagram of an embodiment of the invention.

The circuit of FIG. 1 illustrates the operation of the invention. Power in the form of 115 VAC is supplied by power line 30 to terminal board 20 which contains three separated fastening terminals 3, 2 and 4 for the hot, neutral and ground lines, respectively. The line from position 3 of terminal board 20 is coupled through circuit breaker 6 to position 1 of terminal board 20. Position 2, along with position 1, of terminal board 20 is connected through a DPST switch 40 to a transformer 50 to perform voltage reduction. The output side of the transformer is coupled through positions 1 and 3 of terminal board 10 to positions W3 and W4 of the circuit card under test to supply the circuit card with 24 VAC. A center tap on the transformer is coupled through circuit breaker 8 and position 2 of terminal board 10 to position W2 of the circuit card under test to supply it with 5 VAC. The ground line from position 4 of terminal board 20 is coupled through position 4 of terminal board 10 to a center position of a rotary switch 60 and to position W9 of the circuit card under test. Three jacks J1, J2, and J3, typically the BNC type, are used for the input and output signals. The outer wall connector of each of these jacks are interconnected and also connected to the center position of rotary switch 60. Jacks J1 and J2 receive the input signals and are connected to positions W10 and W8, respectively, of the circuit card under test. Jack J3 serves as the output signal of the test box and receives its signal from position W1 of the terminal board on the circuit card. During normal operation, the output signal from jack J3 is connected to one channel of a dual channel oscilloscope. Rotary switch 60 has four positions, one of which is an "off" position 62. A second position 64 effectively selects a multiplication factor of two by connecting the center position of switch 60 to position W7 on the circuit card under test. A third position 66 selects a multiplication factor of three by connecting the center position of switch 60 to position W6 on the card under test. A fourth position 68 selects a multiplication factor four by connecting the center position of switch 60 to position W5 on the circuit card under test.

The positions or terminals W7, W6 and W5 on the circuit card under test in turn connect to internal nodes of the pulse repetition frequency control circuit and select one of three groundable circuit paths and thereby one of three possible pulse recurrence frequencies for operation of the multiplier inhibitor circuit and the radar set.

The selection of a repetition frequency in a periodically operating electric circuit by, for example (1) changing the value of (or shorting to circuit ground) selected portions of the frequency control network (e.g. resistance segments in an RC oscillator) or by (2) selecting different frequency control quartz crystals is well known in the electrical circuit art.

Figure 2:
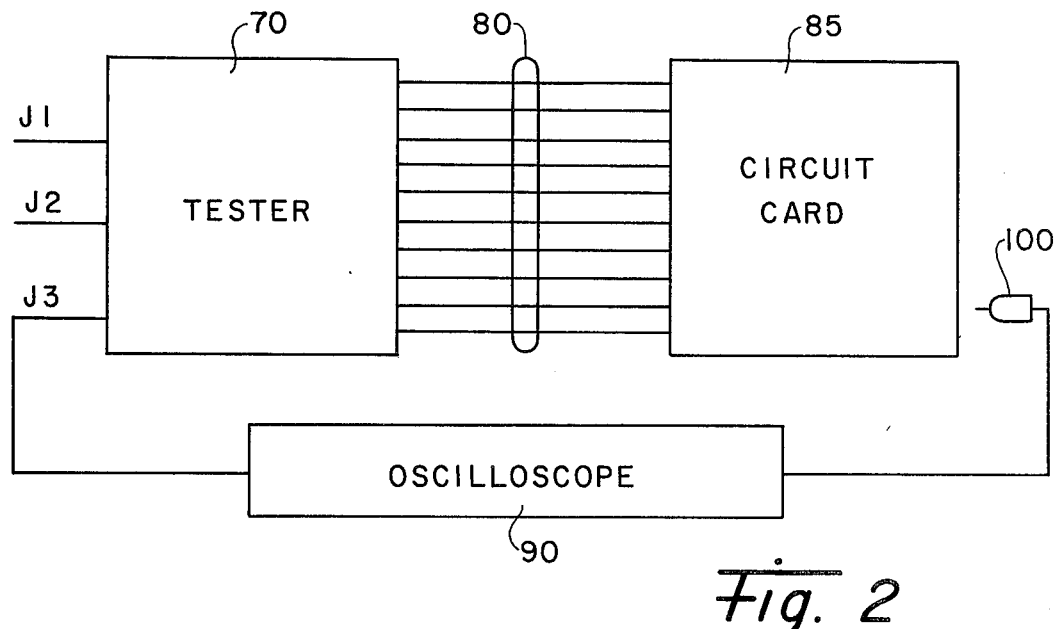
FIG. 2 is a block diagram of an embodiment of the invention.

Referring to FIG. 2, the electrical circuitry of FIG. 1 is contained within block 70. Input signals are supplied to the circuit by input jacks J1 and J2. Signals from the circuitry to a circuit card 85 under test pass through wires 80 corresponding to wires W1 through W10 of FIG. 1. The output signal from the circuit card under test is transitioned back to the test box 70 and made available at output jack J3. During normal troubleshooting operation, the output signal at jack J3 is fed into one channel of a dual channel oscilloscope while the input for the other channel comes from a probe 100. This probe is used to test numerous test points on both sides of the circuit card under test. For ease in troubleshooting, it has been found best to support the circuit card in a circuit card vise, such as a "Pana-Vise" mounting device.

Figure 3:
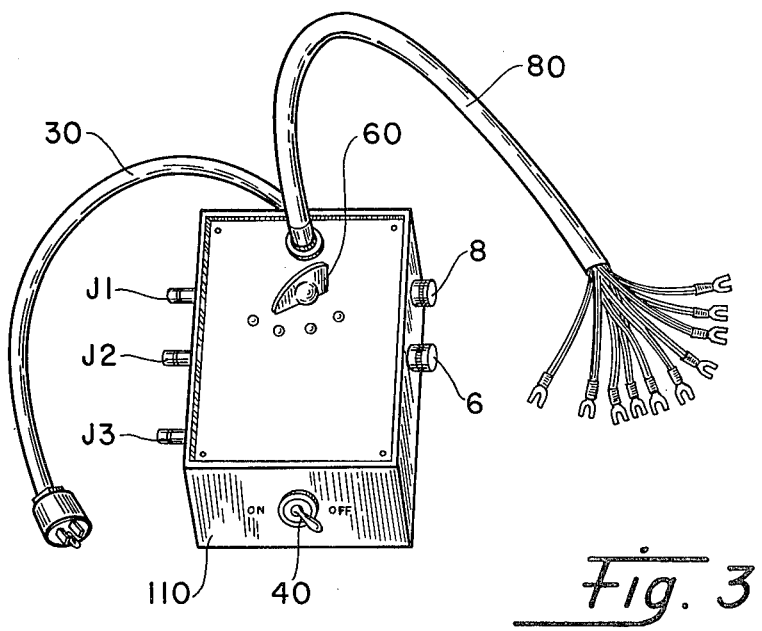
FIG. 3 is a perspective view of an embodiment of the invention.

Referring now to FIG. 3, the electrical circuit as depicted in FIG. 1 is contained in a housing 110 which is completely portable and connects to the multiplier circuit card by a wiring harness 80 which has ten spade terminals at the ends of the wiring and which connect to the terminal board on the circuit card under test. The 115 VAC power line 30 is connected through a rear surface of the housing to power the test box. The multipole switch 60 used to select the multiplication factor is mounted on a top surface while the DPST main power switch 40 is mounted on a front surface. Jacks J1, J2 and J3 extend from the left side of the housing and easy access to circuit breakers 6 and 8 is provided by mounting the circuit breakers on the right side of the housing.

Thus, while preferred constructional features of the invention are embodied in the structure illustrated herein, it is to be understood that changes and variations may be made by the skilled in the art without departing from the spirit and scope of the invention.

I claim:

1. Printed circuit card bench testing apparatus for the pulse recurrence frequency control circuit card in a AN/MSQ-2 and AN/MPS-9 radar set, comprising the combination of:

a test pulse recurrence frequency control card from one of said AN/MSQ-2 and AN/MPS-9 radar sets;

test signal source means for energizing said test card, said means including an operational one of said AN/MSQ-2 and AN/MPS-9 radar sets having active signal supply nodes connectable to said test pulse recurrence frequency control card;

a test apparatus housing;

an electrical energy supply cable containing hot, neutral and ground conductors, said cable being connectable between a source of alternating current energy and a first terminal board in said housing;

an electrical step-down transformer mounted within said housing and including a primary winding and a secondary winding having a winding tap, said secondary winding being connected with said test subject printed circuit card by first and second conductors of a multiconductor electrical cable;

a double pole electrical power switch on said housing and electrically connected between the terminals of said transformer primary winding and the hot and neutral conductor connected terminals of said first terminal board;

a first current responsive electrical circuit breaker on said housing electrically connected intermediate said terminal board hot conductor terminal and an input terminal of said double pole switch;

low voltage source means including a second current responsive electrical circuit breaker on said housing electrically connected between said secondary winding tap and a third conductor of said multiconductor electrical cable for supplying low voltage alternating current from said tap to an input node of said test subject printed circuit card;

first signal conveying means including a first coaxial cable jack on said housing, connected with a fourth conductor of said multiconductor electrical cable for conveying the output signal of said test subject printed circuit for electrical evaluation;

second and third signal conveying means including second and third coaxial cable jacks on said housing and connected with fifth and sixth conductors of said multiconductor electrical cable and connectable with said signal supply nodes in said operational radar set for conveying input signals to said test subject card from said operational radar set;

selector switch means on said housing having a movable wiper arm that is selectably connectable with seventh, eighth and ninth conductors in said multiconductor cable, for manually selecting between one of three possible pulse recurrence frequency multiplication factors in the frequency control circuit of said test card;

a common ground conductor bus located within said housing and connected with a tenth conductor in said multiconductor cable, and with said ground conductor in said electrical energy supply cable, and with the coaxial shield conductor of said three coaxial cable jacks; and signal viewing means including a dual channel oscilloscope having one channel connected with the output signal of said test subject printed circuit card by way of said first coaxial cable jack and the other channel connected to a manual test probe movable to a plurality of selectable test points on either side of said test subject card for tracing and comparing viewed signals from said printed circuit card.

* * * * *